(12) United States Patent
Oohashi et al.

(10) Patent No.: US 7,022,462 B1
(45) Date of Patent: Apr. 4, 2006

(54) PHOTOSENSITIVE RESIN COMPOSITION, PHOTOSENSITIVE ELEMENT USING THE SAME, PROCESS FOR PRODUCING RESIST PATTERN, AND PROCESS FOR PRODUCING PRINTED WIRING BOARD

(75) Inventors: Takeshi Oohashi, Hitachi (JP); Chikara Ishikawa, Hitachi (JP)

(73) Assignee: Hitachi Chemical Company, Ltd., Tokyo (JP)

( * ) Notice: Subject to any disclaimer, the term of this patent is extended or adjusted under 35 U.S.C. 154(b) by 0 days.

(21) Appl. No.: 09/926,033

(22) PCT Filed: Mar. 2, 2000

(86) PCT No.: PCT/JP00/01221

§ 371 (c)(1),
(2), (4) Date: Nov. 7, 2001

(87) PCT Pub. No.: WO00/52529

PCT Pub. Date: Sep. 8, 2000

(30) Foreign Application Priority Data

Mar. 3, 1999 (JP) ................................. 11-055457
Oct. 7, 1999 (JP) ................................. 11-287298

(51) Int. Cl.
*G03F 7/029* (2006.01)
*G03F 7/033* (2006.01)

(52) U.S. Cl. ............................... 430/288.1; 430/281.1; 430/311; 430/920; 430/925

(58) Field of Classification Search ............. 430/270.1, 430/271.1, 288.1, 256, 259, 311, 313, 320, 430/322, 281.1, 325, 920, 925; 526/318.4, 526/323; 525/304
See application file for complete search history.

(56) References Cited

U.S. PATENT DOCUMENTS 4,539,286 A * 9/1985 Lipson et al. ............. 430/277.1
4,925,769 A * 5/1990 Huemmer et al. ........ 430/271.1
6,048,953 A * 4/2000 Kawashima et al. ..... 526/318.4

FOREIGN PATENT DOCUMENTS

| EP | 0128014 A1 | 12/1984 |
|----|-----------|---------|
| EP | 0738927 A2 | 10/1996 |
| JP | 62-204252 | 9/1987 |
| JP | 03-221956 | 9/1991 |
| JP | 10-020491 | 1/1998 |

OTHER PUBLICATIONS

JP 10-020491 A machine translation from the JPO website.*
International Search Report dated Jun. 6, 2000.

* cited by examiner

*Primary Examiner*—John S. Chu
(74) *Attorney, Agent, or Firm*—Westerman, Hattori, Daniels & Adrian, LLP

(57) ABSTRACT

A photosensitive resin composition comprising (A) a carboxyl group-containing binder polymer which contains styrene or a styrene derivative as a copolymerized constituent, (B) a photo-polymerization initiator, and (C) a photo-polymerizable compound which has in its molecule at least one polymerizable ethylenically unsaturated bond and comprises a compound represented by the general formula (I)

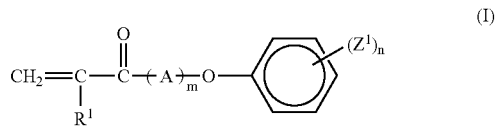

wherein $R^1$ is a hydrogen atom or a methyl group, A is an alkylenoxy group, $Z^1$ is a halogen atom, an alkyl group, a cycloalkyl group, an aryl group, an amino group, an alkylamino group, a dialkylamino group, a nitro group, a cyano group, a mercapto group, an alkylmercapto group, an allyl group, a hydroxyalkyl group, a carboxyalkyl group, an acyl group, an alkoxy group or a group containing an heterocyclic group, m is an integer of 4 to 20, and n is an integer of 0 to 5.

26 Claims, No Drawings

PHOTOSENSITIVE RESIN COMPOSITION, PHOTOSENSITIVE ELEMENT USING THE SAME, PROCESS FOR PRODUCING RESIST PATTERN, AND PROCESS FOR PRODUCING PRINTED WIRING BOARD

TECHNICAL FIELD

The invention relates to a photosensitive resin composition, a photosensitive element using the same, a process for producing a resist pattern and a process for producing a printed wiring board.

BACKGROUND ART

In the manufacturing industry of printed wiring boards, photosensitive elements produced by using a photosensitive resin composition, a support and a protective film have been widely used as the resist materials in etching, plating or the like.

Printed wiring boards are produced by laminating a photosensitive element on a copper substrate, exposing it with patterned light, removing unexposed areas with a developer, carrying out etching or plating to form circuit patterns, and then peeling off the cured areas from the substrate.

Developers mainly used to remove the unexposed areas are of alkali development type, such as a sodium carbonate solution. Developers are used repeatedly so long as they substantially retain the ability of dissolving photosensitive resin composition layers, and photosensitive resin compositions are dissolved or dispersed in the developers during development.

With the recent increase in the density of printed wiring boards, the contact area between copper substrates and patterned photosensitive resin composition layers has been reduced, requiring photosensitive elements which exhibit excellent adhesiveness, resolution, tenting reliability and chemical resistance in etching or plating step.

Also there is the problem of the aggregation of the photosensitive resin composition dissolved or dispersed in developers. When the developer is sprayed again with a pump or the like, the aggregates dispersed in the developers adhere onto developed printed wiring boards, causing undesirable defects during the following etching or plating step. To prevent such defects, photosensitive resin compositions require good dispersion stability in developers.

As to resists improved in chemical resistance, for example, resists containing copolymers of styrene monomers are disclosed in Japanese Patent Application Examined Publication Nos. 55-38961 (1980) and 54-25957 (1979), Japanese Patent Application Unexamined Publication Nos. 2289607 (1990), 4-347859 (1992) and 4-285960 (1992). However, the minimum development time of the resists is so long as to reduce resolution.

To improve chemical resistance, the use of photo-polymerizable compounds having isocyanurate rings is proposed in Japanese Patent Application Unexamined Publication Nos. 60-77844 (1985), 62-290705 (1987), 60-14212 (1985), 59-222480 (1984), 1-14190 (1989), 57-55914 (1982), 5-216224 (1993) and 5-273754 (1993), which however involves the problem that the cured film is hard and brittle.

As to photosensitive resin compositions with good tenting reliability, a photosensitive resin composition using vinylurethane compounds is disclosed in Japanese Patent Application Unexamined Publication No. 7-128851 (1995). However, with the recent increase in the density and accuracy of printed wiring boards, the requirement for high resolution has become yearly strict, and the addition of vinylurethane compounds alone cannot improve the resolution of the photosensitive resin composition. This is assumed to be caused by the poor developability of the isocyanate residues having urethane bonds.

In Japanese Patent Application Unexamined Publication No. 8-179503 (1996) is disclosed that photosensitive resin compositions having a low biologically chemical oxygen demand and a low chemical oxygen demand and being less apt to aggregate in developers are obtainable by using, as an ethylenically unsaturated compound, a specific urethane compound having in its molecule blocked ethylenoxy or propylenoxy groups. The photosensitive resin compositions however involve the defects of low adhesiveness on overdevelopment and insufficient reduction in minimum development time.

In Japanese Patent Application Unexamined Publication No. 5-232699 (1993) disclosed are photosensitive resin compositions containing acrylate compounds, which, having extremely hydrophilic polyalkylene glycol chains, are excellent in developability and resolution. The photosensitive resin compositions involve problems in that those with only polyethylene glycol chains suffer from defective resist shapes, jagged etched-lines or the like, while those with only polypropylene glycol chains tend to separate to scum in alkaline developers, and if the scum adheres to substrates, it causes short circuit or disconnection.

DISCLOSURE OF INVENTION

An object of the invention is to provide a photosensitive resin composition which is excellent in adhesiveness and low tendency to scum.

Accordingly, the invention provides a photosensitive resin composition comprising
  (A) a carboxyl group-containing binder polymer which contains styrene or a styrene derivative as a copolymerized constituent,
  (B) a photo-polymerization initiator, and
  (C) a photo-polymerizable compound having in its molecule at least one polymerizable ethylenically unsaturated bond which comprises a compound represented by the general formula (I)

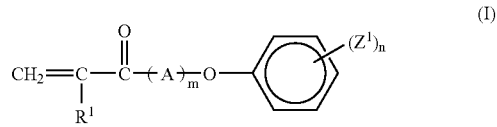

(I)

wherein $R^1$ is a hydrogen atom or a methyl group, A is an alkylenoxy group of 2 to 6 carbon atoms, $Z^1$ is a halogen atom, an alkyl group of 1 to 20 carbon atoms, a cycloalkyl group of 3 to 10 carbon atoms, an aryl group of 6 to 14 carbon atoms, an amino group, an alkylamino group of 1 to 10 carbon atoms, a dialkylamino group of 2 to 20 carbon atoms, a nitro group, a cyano group, a mercapto group, an alkylmercapto group of 1 to 10 carbon atoms, an allyl group, a hydroxyalkyl group of 1 to 20 carbon atoms, a carboxyalkyl group wherein the alkyl group has 1 to 10 carbon atoms, an acyl group having an alkyl group of 1 to 10 carbon atoms, an alkoxy group of 1 to 20 carbon atoms or a group containing an heterocyclic group, m is an integer of 4 to 20, and n is an integer of 0 to 5.

In the photosensitive resin composition of the invention, preferably, the photo-polymerization initiator as the component (B) is a 2,4,5-triarylimidazole dimer. The photosensitive resin composition of this embodiment has more excellent adhesiveness and has high sensitivity.

In the photosensitive resin composition of the invention, preferably, the component (C) is a photo-polymerizable compound having in its molecule at least one polymerizable ethylenically unsaturated bond, which comprises a compound represented by the general formula (I) and a compound represented by the general formula (II)

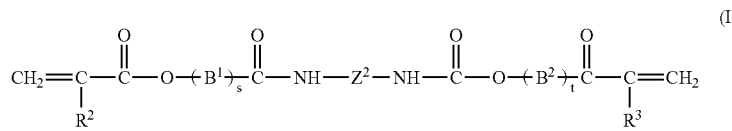

(II)

wherein $R^2$ and $R^3$ each independently are a hydrogen atom or an alkyl group of 1 to 6 carbon atoms, $B^1$ and $B^2$ each independently are as defined above for A in the general formula (I), $Z^2$ is a divalent hydrocarbon group of 1 to 16 carbon atoms, and s and t each independently are an integer of 1 to 28. The photosensitive resin composition of this embodiment is particularly excellent in adhesiveness.

In the photosensitive resin composition of the invention, preferably, the component (A) is a carboxyl group-containing binder polymer which contains styrene or a styrene derivative as a copolymerized constituent and comprises copolymerized constituents consisting of 15 to 35% by weight of methacrylic acid, 10 to 35% by weight of styrene or a styrene derivative and 30 to 75% by weight of a monomer represented by the general formula (III)

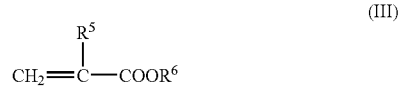

(III)

wherein $R^5$ is a hydrogen atom or a methyl group, and $R^6$ is an alkyl group of 1 to 12 carbon atoms. The photosensitive resin composition of this embodiment is particularly excellent in adhesiveness.

In the photosensitive resin composition of the invention, preferably, the component (A) is a carboxyl group-containing binder polymer which contains styrene or a styrene derivative as a copolymerized constituent and has a weight average molecular weight of 30,000 to 80,000. The photosensitive resin composition of this embodiment is particularly excellent in film quality and resolution.

The photosensitive resin composition of the invention, preferably, comprises 40 to 70 parts by weight of the component (A), 0.1 to 10 parts by weight of the component (B) and 30 to 60 parts by weight of the component (C) relative to 100 parts by weight of a sum total of the component (A) and the component (C). The photosensitive resin composition of this embodiment is particularly excellent in adhesiveness and low tendency to scum.

The invention further provides a photosensitive resin composition comprising
(A') a binder polymer,
(B) a photo-polymerization initiator, and
(C') a photo-polymerizable compound having in its molecule at least one polymerizable ethylenically unsaturated bond which comprises a compound represented by the general formula (V)

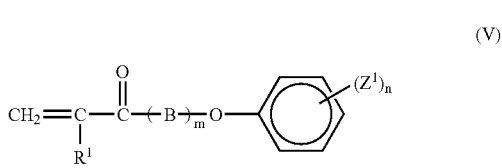

(V)

wherein $R^1$ is a hydrogen atom or a methyl group, B is an ethylenoxy group, $Z^1$ is a halogen atom, an alkyl group of 1 to 20 carbon atoms, a cycloalkyl group of 3 to 10 carbon atoms, an aryl group of 6 to 14 carbon atoms, an amino group, an alkylamino group of 1 to 10 carbon atoms, a dialkylamino group of 2 to 20 carbon atoms, a nitro group, a cyano group, a mercapto group, an alkylmercapto group of 1 to 10 carbon atoms, an allyl group, a hydroxyalkyl group of 1 to 20 carbon atoms, a carboxyalkyl group wherein the alkyl group has 1 to 10 carbon atoms, an acyl group having an alkyl group of 1 to 10 carbon atoms, an alkoxy group of 1 to 20 carbon atoms or a group containing an heterocyclic group, m is an integer of 4 to 20, and n is an integer of 0 to 5.

The invention further provides a photosensitive resin composition comprising
(A') a binder polymer,
(B) a photo-polymerization initiator, and
(C'') a photo-polymerizable compound having in its molecule at least one polymerizable ethylenically unsaturated bond which comprises a compound represented by the general formula (VI)

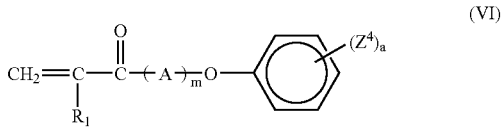

(VI)

wherein $R^1$ is a hydrogen atom or a methyl group, A is an alkylenoxy group of 2 to 6 carbon atoms, $Z^4$ is an alkyl group of 1 to 20 carbon atoms, m is an integer of 4 to 20, and a is an integer of 1 to 5.

Another object of the invention is to provide a photosensitive element which is excellent in adhesiveness, low tendency to scum and workability.

Accordingly, the invention provides a photosensitive element produced by applying the photosensitive resin composition of the invention to a support, and then drying the photosensitive resin composition to form a photosensitive resin composition layer.

In one embodiment, the photosensitive element of the invention has a protective film applied to the photosensitive resin composition layer.

Another object of the invention is to provide a process for producing resist patterns, in which a photosensitive element having excellent adhesiveness, low tendency to scum and extremely good workability is used and which therefore extremely facilitates the production of printed wiring boards with higher density and the automatic production of printed wiring boards.

Accordingly, the invention provides a process for producing a resist pattern comprising laminating the photosensitive element of the invention on a substrate to be processed for forming a circuit, with the photosensitive resin composition layer placed in contact with the substrate, exposing the photosensitive resin composition layer by irradiating it with an active ray in a pattern of an image to radiation-cure exposed areas of the photosensitive resin composition layer, and then developing by removing unexposed areas of the photosensitive resin composition layer.

In one embodiment, a protective film is applied to the photosensitive resin composition layer, and the photosensitive element is laminated on the substrate to be processes for forming a circuit while the protective film is being peeled off from the photosensitive resin composition layer.

Another object of the invention is to provide a process for producing a printed wiring board, in which a photosensitive element having excellent adhesiveness, low tendency to scum and extremely good workability is used for the production of resist patterns and which therefore extremely facilitates the production of printed wiring boards with higher density and the automatic production of printed wiring boards.

Accordingly, the invention provides a process for producing a printed wiring board, comprising etching or plating the substrate bearing the resist pattern produced by the process for producing a resist pattern of the invention.

BEST MODE FOR CARRYING OUT THE INVENTION

Hereinafter, the components contained in the photosensitive resin composition of the invention will be described in detail.

According to the invention, in the component (A) that is a carboxyl group-containing binder polymer containing styrene or a styrene derivative as a copolymerized constituent, the styrene or the styrene derivative is an essential copolymerized constituent to ensure adhesiveness and high resolution on overdevelopment.

Examples of usable styrene derivatives include α-methylstyrene, p-methylstyrene, p-ethylstyrene, p-methoxystyrene, p-ethoxystyrene, p-chlorostyrene and p-bromostyrene. The styrene and styrene derivatives may further have, on their benzene rings, a functional substituent such as a nitro group, a nitrile group, an alkoxyl group, an acyl group, a sulfone group, a hydroxyl group or a halogen atom, but, preferably, have only one alkyl group such as a methyl group or a tert-butyl group. In view of adhesiveness preferred examples are styrene and p-methylstyrene. These styrene and styrene derivatives are used individually or in combination of two or more.

The component (A) to be used in the invention that is a carboxyl group-containing binder polymer containing styrene or a styrene derivative as a copolymerized constituent further contains as another essential copolymerized constituent a carboxyl group-containing monomer which is copolymerizable with styrene or the styrene derivative, and may further contain other vinyl monomers as optional copolymerized constituents.

Examples of usable carboxyl group-containing monomers include acrylic acid, acrylic acid derivatives such as α-bromoacrylic acid, α-chloroacrylic acid, β-furylacrylic acid and β-styrylacrylic acid, methacrylic acid, methacrylic acid derivatives such as α-bromomethacrylic acid, α-chloromethacrylic acid, β-furylmethacrylic acid and β-styrylmethacrylic acid, maleic acid, maleic anhydride, maleic acid monoesters such as monomethyl maleate, monoethyl maleate and monoisopropyl maleate, fumaric acid, cinnamic acid, α-cyanocinnamic acid, itaconic acid, crotonic acid and propiolic acid. These carboxyl group-containing monomers are used individually or in combination of two or more.

Examples of usable vinyl monomers other than styrene, the styrene derivatives and the carboxyl group-containing monomers include acrylamides such as 2,2,3,3-tetrafluoropropylacrylatacrylamide, 2,2,3,3-tetrafluoropropylmethacrylatacrylamide and diacetonacrylamide, acrylonitrile, ethers of vinyl alcohol such as vinyl n-butyl ether, alkyl acrylates and alkyl methacrylates.

Examples of the alkyl acrylates and alkyl methacrylates include the compounds represented by the general formula (III) and derivatives thereof in which the alkyl group has substituent group(s), for example, a hydroxyl group, an epoxy group or a halogen group.

Examples of $R^6$ in the general formula (III) include a methyl group, an ethyl group, a propyl group, a butyl group, a pentyl group, a hexyl group, a heptyl group, an octyl group, a nonyl group, a decyl group, an undecyl group, a dodecyl group and structural isomers of these groups.

Examples of the monomers represented by the general formula (III) include methyl acrylate, ethyl acrylate, propyl acrylate, butyl acrylate, pentyl acrylate, hexyl acrylate, heptyl acrylate, octyl acrylate, 2-ethylhexyl acrylate, nonyl acrylate, decyl acrylate, undecyl acrylate, dodecyl acrylate, methyl methacrylate, ethyl methacrylate, propyl methacrylate, butyl methacrylate, pentyl methacrylate, hexyl methacrylate, heptyl methacrylate, octyl methacrylate, 2-ethylhexyl methacrylate, nonyl methacrylate, decyl methacrylate, undecyl methacrylate and dodecyl methacrylate.

The component (A) that is a carboxyl group-containing binder polymer containing styrene or a styrene derivative as a copolymerized constituent preferably contains 15 to 35% by weight of methacrylic acid, 10 to 35% by weight of styrene or a styrene derivative and 30 to 75% by weight of the monomer represented by the general formula (III) as polymerization constituents.

That is, the content of methacrylic acid is preferably 15 to 35% by weight, more preferably 20 to 30% by weight, particularly preferably 23 to 26% by weight based on the whole quantity of the component (A). If it is less than 15% by weight, the minimum development time may be prolonged to deteriorate the workability, and if more than 35% by weight, adhesiveness may be reduced.

The content of styrene or the styrene derivative is preferably 10 to 35% by weight, more preferably 15 to 30% by weight, particularly preferably 20 to 25% by weight based on the whole quantity of the component (A). If it is less than 10% by weight, the resist may tend to swell to reduce the adhesiveness on overdevelopment, and if more than 35% by weight, the minimum development time may be prolonged to deteriorate the workability.

The content of the monomer represented by the general formula (III) is preferably 30 to 75% by weight, more preferably 40 to 65% by weight, particularly preferably 49 to 57% by weight based on the whole quantity of the component (A). If it is less than 30% by weight, the resist may become brittle and have poor cross-cut properties, and if more than 75% by weight, the adhesiveness may be reduced.

For example, the component (A) may be produced by copolymerizing the above described monomers through vinyl polymerization.

In view of good film quality and high resolution, the component (A) that is a carboxyl group-containing binder polymer containing styrene or a styrene derivative as a copolymerized constituent preferably has a weight average molecular weight of 30,000 to 80,000, more preferably 40,000 to 70,000, particularly preferably 50,000 to 60,000. If the weight average molecular weight is less than 30,000, the film quality may be deteriorated, and if more than 80,000, the resolution may be lowered. Herein, the weight average molecular weight is measured through gel permeation chromatography, based on the calibration curve of a standard, polystyrene.

In the invention, the component (A) that is a carboxyl group-containing binder polymer containing styrene or a styrene derivative as a copolymerized constituent preferably has an acid value of 90 to 500 mgKOH/g, more preferably 90 to 300 mgKOH/g. If the acid value is less than 90 mgKOH/g, the development time may be prolonged, and if more than 500 mgKOH/g, the radiation-cured resist may have poor resistance to developers.

Examples of photo-polymerization initiators usable as the component (B) in the invention include aromatic ketones such as benzophenone, N,N'-tetramethyl-4,4'-diaminobenzophenone (Michler's ketone), N,N'-tetraethyl-4,4'-diaminobenzophenone, 4-methoxy-4'-dimethylaminobenzophenone, 2-benzyl-2-dimethylamino-1-(4-morpholinophenyl) butanone-1, 2-ethylanthraquinone and phenanthrenequinone, benzoin ether compounds such as benzoin methyl ether, benzoin ethyl ether and benzoin phenyl ether, benzoin compounds such as methylbenzoin and ethylbenzoin, benzyl derivatives such as benzyl diethyl ketal, 2,4,5-triarylimidazole dimers, acridine derivatives such as 9-phenylacridine and 1,7-bis(9,9'-acridinyl)heptane, and N-phenylglycine.

In view of adhesiveness and sensitivity, preferred are 2,4,5-triarylimidazole dimers, for example, 2,2'-bis(o-chlorophenyl)-4,5,4',5'-tetraphenyl-1,2'-imidazole dimer, 2-(o-chlorophenyl)-4,5-diphenylimidazole dimer, 2,2'-bis(o-chlorophenyl)-4,4',5,5'-tetra(p-chlorophenyl)imidazole dimer, 2-(o-chlorophenyl)-4,5-di(m-methoxyphenyl)imidazole dimer, 2,2'-bis(o-chlorophenyl)-4,4',5,5'-tetra(p-fluorophenyl)imidazole dimer, 2,2'-bis(o-bromophenyl)-4,4',5,5'-tetra(o-chloro-p-methoxyphenyl)imidazole dimer, 2,2'-bis(o-chlorophenyl)-4,4',5,5'-tetra(o,p-dichlorophenyl) imidazole dimer, 2,2'-bis(o-chlorophenyl)-4,4',5,5'-tetra(o, p-dibromophenyl)imidazole dimer, 2,2'-bis(o-chlorophenyl)-4,4',5,5'-tetra(p-chloronaphthyl)imidazole dimer, 2,2'-bis(m,p-dichlorophenyl)-4,4',5,5'-tetraphenylimidazole dimer, 2,2'-bis(o,p-dichlorophenyl)-4,4',5,5'-tetraphenylimidazole dimer, 2,2'-bis(o,p-dichlorophenyl)-4, 4',5,5'-tetra(o,p-dichlorophenyl)imidazole dimer, 2-(o-fluorophenyl)-4,5-diphenylimidazole dimer, 2-(o-methoxyphenyl)-4,5-diphenylimidazole dimer, 2-(p-methoxyphenyl)-4,5-diphenylimidazole dimer, 2,4-di(p-methoxyphenyl)-5-phenylimidazole dimer, 2-(2,4-dimethoxyphenyl)-4,5-diphenylimidazole dimer, 2-(p-methylmercaptophenyl)-4,5-diphenylimidazole dimer, 2,2'-bis(p-bromophenyl)-4,4',5,5'-tetraphenylimidazole dimer, 2,2'-bis(o-bromophenyl)-4,4', 5,5'-tetra(o,p-dichlorophenyl) imidazole dimer, 2,2'-bis(o-bromophenyl)-4,4',5,5'-tetra(p-iodophenyl)imidazole dimer, 2,2'-bis(m-bromophenyl)-4,4', 5,5'-tetraphenylimidazole dimer and 2,2'-bis(m,p-dibromophenyl)-4,4',5,5'-tetraphenylimidazole dimer. These are used individually or in combination of two or more.

The component (C) to be used in the invention that is a photo-polymerizable compound having in its molecule at least one polymerizable ethylenically unsaturated bond contains the compound represented by the general formula (I) as an essential ingredient.

Examples of A in the general formula (I) and the general formula (VI) include an alkylenoxy group of 2 to 6 carbon atoms, such as an ethylenoxy group, a propylenoxy group, an isopropylenoxy group, a butylenoxy group, a pentylenoxy group and a hexylenoxy group, with an ethylenoxy group preferred in view of adhesiveness. m is an integer of 4 to 20, preferably an integer of 6 to 18 in view of low tendency to scum and resistance to developers, particularly preferably an integer of 8 to 12.

The isopropylene group in the above-mentioned isopropylenoxy group is represented by —$CH(CH_3)CH_2$—. When A in the general formula (I) is an isopropylenoxy group, the group —(A)— may have the structure of either (i)—(—$OCH(CH_3)CH_2$—)— or ii) —(—$O$—$CH_2CH(CH_3)$—)—, and when A is an isopropylenoxy group, each isopropylenoxy group in the group —(A)$_m$— may have the structure of either (i) or (ii), and the plural A's may be identical with or different from each other. When A's include two or more kinds of alkylenoxy groups, the alkylenoxy groups may be linked either randomly or in blocks.

The $Z^1$ in the general formula (I) and the general formula (V) is a halogen atom, an alkyl group of 1 to 20 carbon atoms, a cycloalkyl group of 3 to 10 carbon atoms, an aryl group of 6 to 14 carbon atoms, an amino group, an alkylamino group of 1 to 10 carbon atoms, a dialkylamino group of 2 to 20 carbon atoms, a nitro group, a cyano group, a mercapto group, an alkylmercapto group of 1 to 10 carbon atoms, an allyl group, a hydroxyalkyl group of 1 to 20 carbon atoms, a carboxyalkyl group the alkyl group of which has 1 to 10 carbon atoms, an acyl group the alkyl group of which has 1 to 10 carbon atoms, an alkoxy group of 1 to 20 carbon atoms or a group containing a heterocyclic group. The hydrogen atoms of the alkyl groups in $Z^1$ may be substituted by halogen atoms. In view of resistance to developers, developability and adhesiveness, $Z^1$ is preferably an alkyl group of 1 to 20 carbon atoms, more preferably an alkyl group of 4 to 14 carbon atoms. n is an integer of 0 to 5, preferably an integer of 1 to 3 in view of availability and developability. When n is 2 or more, the plural $Z^1$'s may be identical with or different from each other.

Examples of halogen atoms for $Z^1$ in the general formula (I) and the general formula (V) include fluorine, chlorine, bromine, iodine and astatine.

Examples of alkyl groups of 1 to 20 carbon atoms for $Z^1$ and $Z^4$ in the general formula (I), the general formula (V) and the general formula (VI) include a methyl group, an ethyl group, an n-propyl group, an isopropyl group, a n-butyl group, a sec-butyl group, a tert-butyl group, a pentyl group, a hexyl group, a heptyl group, an octyl group, a nonyl group, a decyl group, an undecyl group, a dodecyl group, a tridecyl group, a tetradecyl group, a pentadecyl group, an octadecyl group, a nonadecyl group and eicocyl group, with alkyl groups of 7 to 12 carbon atoms preferred, and a nonyl group particularly preferred.

Examples of cycloalkyl groups of 3 to 10 carbon atoms for $Z^1$ in the general formula (I) and the general formula (V) include a cyclopropyl group, a cyclobutyl group, a cyclopentyl group, a cyclohexyl group, a cycloheptyl group and a cyclooctyl group.

Examples of aryl groups of 6 to 14 carbon atoms for $Z^1$ in the general formula (I) and the general formula (V) include a phenyl group, a tolyl group, a xylyl group, a biphenylyl group, a naphthyl group, an anthryl group and a phenanthryl group, which may be substituted by a halogen atom, an amino group, a nitro group, a cyano group, a mercapto group, an allyl group or an alkyl group of 1 to 20 carbon atoms.

Examples of alkylamino groups of 1 to 10 carbon atoms for $Z^1$ in the general formula (I) and the general formula (V) include a methylamino group, an ethylamino group, a propylamino group and an isopropylamino group.

Examples of dialkylamino groups of 2 to 20 carbon atoms for $Z^1$ in the general formula (I) and the general formula (V) include a dimethylamino group, a diethylamino group, a dipropylamino group and a diisopropylamino group.

Examples of alkylmercapto groups of 1 to 10 carbon atoms for $Z^1$ in the general formula (I) and the general formula (V) include a methylmercapto group, an ethylmercapto group and a propylmercapto group.

Examples of hydroxyalkyl groups of 1 to 20 carbon atoms for $Z^1$ in the general formula (I) and the general formula (V) include a hydroxymethyl group, a hydroxyethyl group, a hydroxypropyl group, a hydroxyisopropyl group and a hydroxybutyl group.

Examples of carboxyalkyl groups for $Z^1$ in the general formula (I) and the general formula (V) the alkyl groups of which has 1 to 10 carbon atoms include a carboxymethyl group, a carboxyethyl group, a carboxypropyl group and a carboxybutyl group.

Examples of acyl groups for $Z^1$ in the general formula (I) and the general formula (V) the alkyl group of which has 1 to 10 carbon atoms include a formyl group, an acetyl group, a propionyl group, a butyryl group, an isobutyryl group, a valeryl group, an isovaleryl group and a pivaroyl group.

Examples of alkoxy groups of 1 to 20 carbon atoms for $Z^1$ in the general formula (I) and the general formula (V) include a methoxy group, an ethoxy group, a propoxy group and a butoxy group.

Examples of groups containing a heterocyclic group for $Z^1$ in the general formula (I) and the general formula (V) include a furyl group, a thienyl group, a pyrrolyl group, a thiazolyl group, an indolyl group and a quinolyl group.

Examples of the compounds represented by the general formula (I) include nonylphenoxypoly(ethylenoxy) acrylates, nonylphenoxypoly(ethylenoxy) methacrylates, nonylphenoxypoly(propylenoxy) acrylates, nonylphenoxypoly(propylenoxy) methacrylates, butylphenoxypoly(ethylenoxy) acrylates, butylphenoxypoly(ethylenoxy) methacrylates, butylphenoxypoly(propylenoxy) acrylates and butylphenoxypoly(propylenoxy) methacrylates.

Examples of the nonylphenoxypoly(ethylenoxy) acrylates include nonylphenoxytetra(ethylenoxy) acrylate, nonylphenoxypenta(ethylenoxy) acrylate, nonylphenoxyhexa(ethylenoxy) acrylate, nonylphenoxyhepta(ethylenoxy) acrylate, nonylphenoxyocta(ethylenoxy) acrylate, nonylphenoxynona(ethylenoxy) acrylate, nonylphenoxydeca(ethylenoxy) acrylate and nonylphenoxyundeca(ethylenoxy) acrylate.

Examples of the nonylphenoxypoly(ethylenoxy) methacrylates include nonylphenoxytetra(ethylenoxy) methacrylate, nonylphenoxypenta(ethylenoxy)methacrylate, nonylphenoxyhexa(ethylenoxy) methacrylate, nonylphenoxyhepta(ethylenoxy) methacrylate, nonylphenoxyocta(ethylenoxy) methacrylate, nonylphenoxynona(ethylenoxy) methacrylate, nonylphenoxydeca(ethylenoxy) methacrylate and nonylphenoxyundeca(ethylenoxy) methacrylate.

Examples of the butylphenoxypoly(ethylenoxy) acrylates include butylphenoxytetra(ethylenoxy) acrylate, butylphenoxypenta(ethylenoxy) acrylate, butylphenoxyhexa(ethylenoxy) acrylate, butylphenoxyhepta(ethylenoxy) acrylate, butylphenoxyocta(ethylenoxy) acrylate, butylphenoxynona(ethylenoxy) acrylate, butylphenoxydeca(ethylenoxy) acrylate and butylphenoxyundeca(ethylenoxy) acrylate.

Examples of the butylphenoxypoly(ethylenoxy) methacrylates include butylphenoxytetra(ethylenoxy)methacrylate, butylphenoxypenta(ethylenoxy) methacrylate, butylphenoxyhexa(ethylenoxy) methacrylate, butylphenoxyhepta(ethylenoxy) methacrylate, butylphenoxyocta(ethylenoxy) methacrylate, butylphenoxynona(ethylenoxy) methacrylate, butylphenoxydeca(ethylenoxy) methacrylate and butylphenoxyundeca(ethylenoxy) methacrylate.

In view of flexibility, it is preferable that the component (C) [and the component (C') and the component (C'')] to be used in the invention that is a photo-polymerizable compound having in its molecule at least one polymerizable ethylenically unsaturated bond further contains, in addition to the compound represented by the general formula (I), a compound represented by the general formula (II), particularly preferably a compound represented by the general formula (IV)

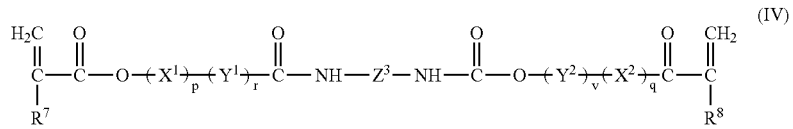

(IV)

wherein $R^7$ and $R^8$ have the same definition as that of $R^2$ in the general formula (II), $Z^3$ has the same definition as that of $Z^2$ in the general formula (II), $X^1$ and $X^2$ are an ethylenoxy group, $Y^1$ and $Y^2$ each independently are a propylenoxy group, an isopropylenoxy group, a butylenoxy group, a pentylenoxy group or a hexylenoxy group, p, q, r and v each independently are an integer of 1 to 14.

In the general formulae (II) and (IV), $R^2$, $R^3$, $R^7$ and $R^8$ each independently are a hydrogen atom or an alkyl group of 1 to 6 carbon atoms, such as a methyl group, an ethyl group, a n-propyl or an isopropyl group. When r and v that are the numbers of the repeating units $Y^1$ and $Y^2$ are 2 or more, the two or more $Y^1$'s and the two or more $Y^2$'s, respectively, may be identical with or different from each other, and the arrangements of $Y^5$'s of two or more kinds and $Y^2$'S of two or more kinds may be either random or block. Also the arrangement of $X^1$, $X^2$, $Y_1$ and $Y^2$ may be either random or block.

Examples of divalent hydrocarbon groups of 1 to 16 carbon atoms for $Z^2$ and $Z^3$ in the general formulae (II) and (IV) include an alkylene group, such as an ethylene group, a hexylene group, a 2-ethylhexylene group, a trimethylhexylene group or a decylene group, a cycloalkylene group, such as a cyclohexylene group or a bicyclohexylene group, and an arylene group, such as a phenylene group, a biphenylylene group or a naphthylene group.

Examples of the compounds represented by the general formulae (II) and (IV) include UA-11 and UA-13 (Trade names) produced by Shin-Nakamura Kagaku Kogyo Co., Ltd.

Examples of other photo-polymerizable compounds having in their molecules at least one polymerizable ethylenically unsaturated bond than the compounds represented by the general formulae (I), (II) and (IV) include polyhydric alcohols, compounds obtainable by the reaction of an polyhydric alcohol with an α, β-unsaturated carboxylic acid, 2,2-bis[4-(acryloxypolyethoxy)phenyl]propanes, 2,2-bis[4-(methacryloxypolyethoxy)phenyl]propanes, compounds obtainable by the reaction of a glycidyl group-containing compound with an α, β-unsaturated carboxylic acid, urethane monomers, γ-chloro-β-hydroxypropyl- β'-acryloyloxyethyl-o-phthalate, γ-chloro-β-hydroxypropyl-β'-methacryloyloxyethyl-o-phthalate, β-hydroxyethyl-β'-acryloyloxyethyl-o-phthalate, β-hydroxyethyl-β'-methacryloyloxyethyl-o-phthalate, β-hydroxypropyl-β'-acryloyloxyethyl-o-phthalate, β-hydroxypropyl-β'-methacryloyloxyethyl-o-phthalate, alkyl acrylates and alkyl methacrylates.

Examples of the compounds obtainable by the reaction of a polyhydric alcohol with an α, β-unsaturated carboxylic acid include polyethylene glycol diacrylates with 2 to 14 ethylene groups, polyethylene glycol dimethacrylates with 2 to 14 ethylene groups, polypropylene glycol diacrylates with 2 to 14 propylene groups, polypropylene glycol dimethacrylates with 2 to 14 propylene groups, trimethylolpropane diacrylate, trimethylolpropane dimethacrylate, trimethylolpropane triacrylate, trimethylolpropane trimethacrylate, trimethylolpropane ethoxytriacrylate, trimethylolpropane ethoxytrimethacrylate, tetramethylolmethane triacrylate, tetramethylolmethane trimethacrylate, tetramethylolmethane tetracrylate, tetramethylolmethane tetramethacrylate, polypropylene glycol diacrylates with 2 to 14 propylene groups, polypropylene glycol dimethacrylates with 2 to 14 propylene groups, dipentaerithritol pentacrylate, dipentaerithritol pentamethacrylate, dipentaerithritol hexacrylate and dipentaerithritol hexamethacrylate.

Examples of the α, β-unsaturated carboxylic acids include acrylic acid and methacrylic acid.

Examples of the 2,2-bis[4-(acryloxypolyethoxy)phenyl] propanes include 2,2-bis[4-(acryloxydiethoxy)phenyl]propane, 2,2-bis[4-(acryloxytriethoxy)phenyl]propane, 2,2-bis [4-(acryloxypentaethoxy)phenyl]propane and 2,2-bis[4-(acryloxydecaethoxy)phenyl]propane.

Examples of the 2,2-bis[4-(methacryloxypolyethoxy)phenyl]propanes include 2,2-bis[4-(methacryloxydiethoxy)phenyl]propane, 2,2-bis[4-(methacryloxytriethoxy)phenyl]propane, 2,2-bis[4-(methacryloxypentaethoxy)phenyl]propane and 2,2-bis[4-(methacryloxydecaethoxy)phenyl]propane. 2,2-bis[4-(methacryloxypentaethoxy)phenyl]propane is commercially available by the trade name of BPE-500 (produced by Shin-Nakamura Kagaku Kogyo Co., Ltd.).

Examples of the glycidyl group-containing compounds include trimethylolpropane triglycidyl ether triacrylate, trimethylolpropane triglycidyl ether trimethacrylate, 2,2-bis(4-acryloxy-2-hydroxy-propyloxyphenyl)propane and 2,2-bis (4-methacryloxy-2-hydroxy-propyloxyphenyl)propane.

Examples of the urethane monomers include addition reaction products of an acrylic or methacrylic monomer having an OH group at the β-position with isophorone diisocyanate, 2,6-toluene diisocyanate, 2,4-toluene diisocyanate or 1,6-hexamethylene diisocyanate; and tris(methacryloxytetraethyleneglycolisocyanatehexamethylene) isocyanurate.

Examples of the alkyl acrylates include methyl acrylate, ethyl acrylate, butyl acrylate and 2-ethylhexyl acrylate.

Examples of the alkyl methacrylates include methyl methacrylate, ethyl methacrylate, butyl methacrylate and 2-ethylhexyl methacrylate.

These compounds are used individually or in combination of two or more.

The component (A') that is used in the present invention as a binder polymer is not particularly limited. For example, as the component (A'), the above-described component (A) may be used, and polymers which do not contain styrene or a styrene derivative as a copolymerization constituent may also be used. The preferred ranges of the weight average molecular weight and acid value of the component (A') are the same as those described for the component (A).

The quantity of the component (A) to be used in the invention that is the carboxyl group-containing binder polymer containing styrene or a styrene derivative as a copolymerized constituent is preferably 40 to 70 parts by weight, more preferably 45 to 60 parts by weight, particularly preferably 50 to 55 parts by weight based on 100 parts by weight of the sum total of the component (A) and the component (C). If it is less than 40 parts by weight, the radiation-cured product may become brittle, and the photosensitive element produced therefrom may have poor film quality, and if it is more than 70 parts by weight, the adhesiveness and resolution may be lowered.

The quantity of the component (B) that is the photopolymerization initiator to be used in the invention is preferably 0.1 to 10 parts by weight, more preferably 1 to 8 parts by weight, particularly preferably 2 to 5 parts by weight based on 100 parts by weight of the sum total of the component (A) and the component (C). If it is less than 0.1 parts by weight, the sensitivity may become insufficient, and if it is more than 10 parts by weight, the absorption of lights near the surface of the composition may increase at the time of exposure, causing insufficient radiation-cure of the inside.

The quantity of the component (C) that is the photopolymerizable compound to be used in the invention is preferably 30 to 60 parts by weight, particularly preferably 45 to 50 parts by weight based on 100 parts by weight of the sum total of the component (A) and the component (C).

The content of the compound represented by the general formula (I) in the component (C) is preferably 3 to 20 parts by weight, more preferably 5 to 20 parts by weight based on 100 parts by weight of the sum total of the component (A) and the component (C). If it is less than 3 parts by weight, scumming may increase, the sensitivity may become insufficient to form strong and flexible cured film, and if it is more than 20 parts by weight, the sensitivity may become insufficient.

The content of the compound represented by the general formula (II) in the component (C) is preferably 5 to 40 parts by weight, more preferably 7 to 30 parts by weight, particularly preferably 10 to 25 parts by weight based on 100 parts by weight of the sum total of the component (A) and the component (C). If it is less than 5 parts by weight, the sensitivity may become insufficient to form strong and flexible cured film, and if it is more than 40 parts by weight, the sensitivity may become insufficient.

The quantity of the component (A') that is the binder polymer to be used in the invention is preferably 40 to 70 parts by weight, more preferably 45 to 60 parts by weight, particularly preferably 50 to 55 parts by weight based on 100 parts by weight of the sum total of the component (A') and the component (C') or the component (C").

The quantity of the component (B) that is the photopolymerization initiator to be used in the invention is preferably 0.1 to 10 parts by weight, more preferably 1 to 8 parts by weight, particularly preferably 2 to 5 parts by weight based on 100 parts by weight of the sum total of the component (A') and the component (C') or the component (C").

The quantity of the component (C') or the component (C") that is the photo-polymerizable compound to be used in the invention is preferably 30 to 60 parts by weight, particularly preferably 45 to 50 parts by weight based on 100 parts by weight of the sum total of the component (A') and the component (C') or the component (C").

The content of the compound represented by the general formula (V) in the component (C') is preferably 3 to 20 parts by weight, more preferably 5 to 20 parts by weight based on 100 parts by weight of the sum total of the component (A') and the component (C'). Also, the content of the compound represented by the general formula (VI) in the component (C") is preferably 3 to 20 parts by weight, more preferably 5 to 20 parts by weight based on 100 parts by weight of the sum total of the component (A') and the component (C").

The content of the compound represented by the general formula (II) in the component (C') or the component (C") is preferably 5 to 40 parts by weight, more preferably 7 to 30 parts by weight, particularly preferably 10 to 25 parts by weight based on 100 parts by weight of the sum total of the component (A') and the component (C') or the component (C").

The photosensitive resin composition of the invention may optionally contain dyes such as Malachite Green, photo-couplers such as leuco crystal violet, anti-heat-coloring agents, plasticizers such as p-toluenesulfonamide, pigments, fillers, anti-foaming agents, flame retardants, stabilizers, adhesiveness improvers, leveling agents, peeling promoters, antioxidants, perfumes, imaging agents and heat-crosslinking agents, in their respective quantities of 0.01 to 20 parts by weight based on 100 parts by weight of the sum total of the component (A) and the component (C). These may be used individually or in combination of two or more.

The photosensitive resin composition may be applied as it is or, if necessary, in a state of a solution of a solid content of 30 to 60% by weight by dissolving it in a solvent of a mixture of solvents, such as methanol, ethanol, acetone, methyl ethyl ketone, methyl cellosolve, ethyl cellosolve, toluene or N,N-dimethylformamide.

It is not limitative but preferable to use the photosensitive resin composition of the invention by applying it as a liquid resist to metallic surface, for example the surface of copper, copper alloys, nickel, chromium, iron, iron alloys such as stainless steel, preferably copper or copper alloys, and drying to form a photosensitive resin composition layer, and then optionally coating it with a protective film, or in a form of a photosensitive element.

The thickness of the photosensitive resin composition layer depends on its use, and after drying, the thickness is preferably 1 to 200 µm, more preferably 1 to 100 µm, particularly preferably 1 to 30 µm. If the thickness is less than 1 µm, application may be difficult in industrial processes, and photosensitive resin composition layers thicker than 100 µm cannot take much effect of the invention and may have low sensitivity. If the thickness is more than 200 µm, the bottom portion of resist may become difficult to radiation-cure. The protective film that is optionally applied to the photosensitive resin composition layer is inert polyolefin film, such as polyethylene or polypropylene, with polyethylene film preferred in view of peelability from the photosensitive resin composition layer.

The photosensitive element is obtainable by applying the photosensitive resin composition to a support, such as a polymer film made of polyethyleneterephthalate, polypropylene, polyethylene or a polyester, and then drying the photosensitive resin composition to form a photosensitive resin composition layer. The application may be carried out by any known method, such as application using a roll coater, a comma coater, a gravure coater, an air knife coater, a die coater or a bar coater. The drying may be carried out at 80 to 150° C. for about 5 to 30 minutes.

The polymer film should be removable from the photosensitive resin composition layer later, and, therefore, should not be subjected to a surface treatment which makes it unremovable nor made of an unremovable material. The thickness of the polymer film is preferably 1 to 100 µm, more preferably 1 to 30 µm. Polymer films thinner than 1 µm may have so poor mechanical strength as to cause troubles such as breakage of the polymer film on application, and those thicker than 30 µm may increase the cost due to reduction of resolution.

It is possible to use one polymer film as the support film for supporting the photosensitive resin composition layer, and to laminate another polymer film as the protective film on the photosensitive resin composition layer.

The obtained photosensitive element of the invention comprising the two layers consisting of the photosensitive resin composition layer and the polymer film (support) may be stored as it is or by laminating a protective film on the other face of the photosensitive resin composition layer and winding it into a roll.

The production of resist patterns by using the photosensitive element may be performed, for example, by removing the protective film, if any, and then laminating the photosensitive element on a substrate to be processed for forming circuits, with the photosensitive resin composition layer heated and pressed against the substrate. In view of adhesiveness and conformability, the lamination is preferably carried out under reduced pressure. The surface to be subjected to the lamination is not limited but is generally a metal surface. The preferred but not limitative temperature to which the photosensitive resin composition layer is heated is 70 to 130° C., and the preferred but not limitative pressure of the pressing is 0.1 to 1.0 MPa (1 to 10 kg/cm$^2$). When the photosensitive resin composition layer is heated to 70 to 130° C. as described above, the substrate to be processed for forming circuits does not require preheating, but may be preheated to further improve the lamination workability.

After lamination, the photosensitive resin composition layer is irradiated with an active ray, for example, an active ray of 1 to 500 mJ/cm$^2$, in a pattern of an image through a negative or positive mask pattern, so-called art work. When the photosensitive resin composition layer bears a transparent polymer film, it may be irradiated with the active ray through the polymer film, and when the polymer film is not transparent, it should be removed. To protect the photosensitive resin composition layer, it is preferable to use a transparent polymer film and to irradiate with an active ray through the transparent without removing it.

The source of the active ray may be any known light source capable of effectively emitting ultraviolet, such as a carbon-arc lamp, a mercury-vapor-arc lamp, an ultra-pressure mercury-arc lamp, a high-pressure mercury-arc lamp or a xenon-arc lamp. Other light sources capable of effectively emitting visible light, such as a photographic flood electric lamp or a solar lamp are also usable. Since the photopolymerization initiator contained in the photosensitive resin composition layer, in general, has maximum sensitivity in the region of ultraviolet, it is preferable, in such a case, to use a light source of active rays which effectively emits ultraviolet.

After exposure, the support, if any, on the photosensitive resin composition layer is removed, and then development is carried out by removing the unexposed areas with a developer, such as an aqueous alkaline solution, through a known method, such as spraying, oscillatory dipping, brushing or scrubbing, to produce a resist pattern.

Examples of developers used in the invention are alkaline, aqueous solutions, which are safe and stable and easy to handle. Examples of the bases in the alkaline, aqueous solution include alkali hydroxides, such as hydroxides of lithium, sodium or potassium, alkali carbonates, such as carbonates or bicarbonates of lithium, sodium, potassium or ammonium, phosphates of alkali metals, such as potassium phosphate and sodium phosphate, pyrophosphates of alkali metals, such as sodium pyrophosphate and potassium pyrophosphate.

Preferred examples of the alkaline, aqueous solutions to be used for development include a 0.1 to 5% by weight-dilute solution of sodium carbonate, a 0.1 to 5% by weight-dilute solution of potassium carbonate, a 0.1 to 5% by weight-dilute solution of sodium hydroxide and a 0.1 to 5% by weight-dilute solution of sodium tetraborate.

The alkaline, aqueous solution for development is adjusted preferably to pH 9–11 and is adjusted to a temperature adapted to the developability of the photosensitive resin composition layer.

The aqueous alkaline solution may contain additives, such as surfactants, anti-foaming agents or small quantities of organic solvents for promoting development.

The development may be carried out, for example, by dipping or spraying, and high-pressure spraying is most suited for improving resolution.

After development, the obtained resist pattern may optionally be further cured by heating to about 60 to 250° C. or by exposure with light of 0.2 to 10 mJ/cm$^2$.

The etching after the development may be carried out with a cupric chloride solution, a ferric chloride solution, an alkali etching solution or a hydrogen peroxide etching solution, and a cupric chloride solution, having good etch factor, is preferable.

In the production of a printed wiring boards by using the photosensitive element of the invention, the surface of the substrate to be processed for forming circuits is treated by a known method, such as etching or plating, by using the developed resist pattern as a mask.

Examples of plating methods include copper-plating, such as cupric sulfate-plating or cupric pyrophosphate-plating, solder plating such as high-throw solder plating, nickel plating such as Watts bath (nickel sulfate-nickel chloride) plating or nickel sulfamate-plating, and gold plating such as hard gold-plating or soft gold-plating.

Subsequently, the resist pattern is peeled off with a more strongly alkaline, aqueous solution than the alkaline, aqueous solution used for development. Examples of the strongly alkaline, aqueous solution include a 1 to 5% by weight-aqueous solution of sodium hydroxide and a 1 to 5% by weight-aqueous solution of potassium hydroxide.

According to the invention, the process for producing printed wiring boards may also be used to produce multilayer printed wiring boards.

EXAMPLES 1 to 4 and COMPARATIVE EXAMPLES 1 to 4

The components (A) with the ratios of the constituents as given in Table 1 were synthesized by vinyl copolymerization.

TABLE 1

|  |  | (A) Carboxyl group-containing binder polymer | |
|---|---|---|---|
|  |  | a | b |
| Composition (% by weight) | Methacrylic acid | 20 | 20 |
|  | Styrene | 20 | — |
|  | Methyl methacrylate | 60 | 80 |
| Property | Weight average molecular weight | 60,000 | 60,000 |
|  | Acid value (mgKOH/g) | 130 | 130 |

The materials as given in Table 2 including components (B) and other components and solvents were mixed, the components (A) and the components (C) as given in Table 3 were added to and dissolved in the mixture, to give solutions of photosensitive resin compositions.

TABLE 2

|  | Materials | Quantity |
|---|---|---|
| Component (B) | 2-(o-chlorophenyl)-4,5-diphenylimidazole dimer | 3.0 g |
|  | N,N'-tetraethyl-4,4'-diaminobenzophenone | 0.2 g |
| Other components | Leuco crystal violet | 0.5 g |
|  | Malachite green | 0.05 g |
| Solvents | Acetone | 10.0 g |
|  | Toluene | 10.0 g |
|  | Methanol | 3.0 g |
|  | N,N-dimethylformamide | 3.0 g |

TABLE 3

|  |  | Example No. | | | | Comparative Example No. | | | |
|---|---|---|---|---|---|---|---|---|---|
| Materials | | 1 | 2 | 3 | 4 | 1 | 2 | 3 | 4 |
| (A) | a | 60 | 60 | — | — | 60 | 60 | 60 | — |
|  | b | — | — | 60 | 60 | — | — | — | 60 |
| (C) | Nonylphenoxyl-octa(ethylenoxy) acrylate | 10 | 10 | 10 | 10 | — | — | — | — |
|  | Nonylphenoxyethylenoxy acrylate | — | — | — | — | 10 | — | — | — |
|  | EO,PO-modified urethane dimethacrylate*[1] | 10 | — | 10 | — | 10 | 10 | 10 | 10 |

TABLE 3-continued

| | Example No. | | | | Comparative Example No. | | | |
|---|---|---|---|---|---|---|---|---|
| Materials | 1 | 2 | 3 | 4 | 1 | 2 | 3 | 4 |
| β-hydroxypropyl-β'-methacryloyloxyethyl o-phthalate | — | — | — | — | — | — | 30 | — |
| 2,2-bis[4-(methacryloxypentaethoxy)-phenyl]propane | 20 | 30 | 20 | 30 | 20 | 20 | 30 | 30 |

*[1] A compound of the general formula (IV) wherein $R^7$ and $R^8$ each are a methyl group, $X^1$ and $X^2$ each are an ethylenoxy group, $Y^1$ and $Y^2$ each are an isopropylenoxy group, $Z^3$ is a hexylene group, p and q each are 1, and r and v each are 9.

Each of the solutions of the photosensitive resin compositions prepared as above was applied evenly to a polyethyleneterephthalate film of 16 μm in thickness (produced by Teijin Ltd., type: GS) and dried in a hot air convection dryer of 100° C. for 10 minutes, to give photosensitive elements. The dried photosensitive resin composition layers were 20 μm in thickness.

The copper-surfaces of copper-clad laminates (produced by Hitachi Chemical Company, Ltd., trade name: MCL-E-61), which are glass-epoxy materials having both sides clad with copper foil (35 μm thick), were ground with a grinder equipped with a brush of #600 (produced by Sankei Co., Ltd.), washed with water, and dried in an air current. The copper-clad laminates were heated to 80° C., and the photosensitive resin composition layers of the above-described photosensitive elements, respectively, were laminated on the copper surfaces of the heated copper-clad laminates at 120° C. under a pressure of 0.4 MPa (4 kgf/cm$^2$).

Subsequently, by using an exposure device HMW-590 (produced by Oak Co., Ltd.) with a high-pressure mercury-arc lamp, a photo-tool with a Stofer-21-steps step tablet as a negative mask and a photo-tool with wiring patterns of the line width/space width ratios of 10/10 to 50/50 (unit: μm) as a negative mask for evaluation of adhesiveness, exposures were carried out with energy adjusted so that resists of 7 steps (step Nos. 1–7) remain after development. Then the polyethyleneterephthalate films were removed, and developments were carried out by spraying a 1% by weight-aqueous sodium carbonate solution at 30° C. The evaluation of adhesiveness was based on the width of the thinnest line that remained adhering after development. As to the evaluation of adhesiveness, the smaller the width is, the better the adhesiveness is.

To examine scumming, photosensitive resin composition layers were peeled off by a size of 0.2 cm$^2$ from the photosensitive elements produced as above, put in a 1.0% by weight-aqueous sodium carbonate solution respectively, and then stirred with a stirrer for 2 hours at ambient temperature. To the resulting emulsions were added a polypropylene anti-foaming agent to a concentration of 0.1% by weight, stirred further for 30 minutes. After allowed to stand twice around the clock, the emulsions were observed for scum. The results are given in Table 4.

TABLE 4

| | Adhesiveness | Scumming |
|---|---|---|
| Example 1 | 20 | No |
| Example 2 | 25 | No |
| Example 3 | 30 | No |
| Example 4 | 35 | No |
| Comp. Example 1 | 20 | Scummed |
| Comp. Example 2 | 20 | Scummed |
| Comp. Example 3 | 20 | Scummed |
| Comp. Example 4 | 30 | Scummed |

INDUSTRIAL APPLICABILITY

The photosensitive resin composition of the invention is excellent in adhesiveness and low tendency to scum and, therefore, is extremely useful as a liquid resist or a photosensitive element.

The photosensitive element of the present invention is excellent in adhesiveness, low tendency to scum and workability, and therefore, facilitates the production of printed wiring boards with higher density and the automatic production of printed wiring boards.

The process of the invention for producing resist patterns facilitates the production of printed wiring boards with higher density and the automatic production of printed wiring boards because it uses a photosensitive element having excellent adhesiveness, low tendency to scum and extremely good workability.

The process of the invention for producing a printed wiring board also facilitates the production of printed wiring boards with higher density and the automatic production of printed wiring boards because it uses a photosensitive element having excellent adhesiveness, low tendency to scum and extremely good workability for the production of resist patterns.

What is claimed is:

1. A photosensitive resin composition comprising
   (A) a carboxyl group-containing binder polymer which contains styrene or a styrene derivative as a copolymerized constituent,
   (B) a 2,4,5-triarylimidazole dimer as a photo-polymerization initiator, and
   (C) a photo-polymerizable compound having in its molecule at least one polymerizable ethylenically unsaturated bond which comprises a compound represented by the general formula (I)

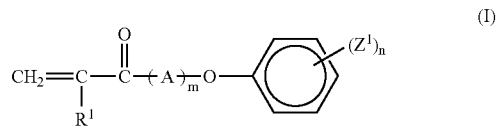

wherein $R^1$ is a hydrogen atom or a methyl group, A is an alkylenoxy group of 2 to 6 carbon atoms, $Z^1$ is a halogen atom, an alkyl group of 1 to 20 carbon atoms, a cycloalkyl group of 3 to 10 carbon atoms, an aryl group of 6 to 14 carbon atoms, an amino group, an alkylamino group of 1 to 10 carbon atoms, a dialkylamino group of 2 to 20 carbon atoms, a nitro group, a cyano group, a mercapto group, an alkylmercapto group of 1 to 10 carbon atoms, an allyl group, a hydroxyalkyl group of 1 to 20 carbon atoms, a carboxyalkyl group wherein the alkyl group has 1 to 10 carbon atoms, an acyl group having an alkyl group of 1 to 10 carbon atoms, an alkoxy group of 1 to 20 carbon atoms or a group containing an heterocyclic group, m is an integer of 6 to 20, and n is an integer of 0 to 5.

2. The photosensitive resin composition of claim 1, wherein the component (C) is a photo-polymerizable compound having in its molecule at least one polymerizable ethylenically unsaturated bond, which comprises a compound represented by the general formula (I) and a compound represented by the general formula (II)

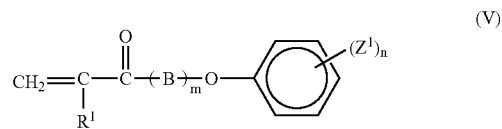

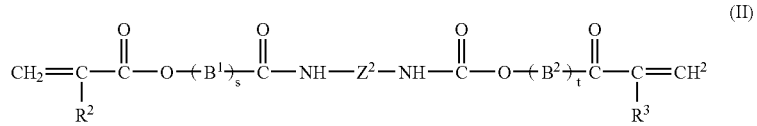

wherein $R^2$ and $R^3$ each independently are a hydrogen atom or an alkyl group of 1 to 6 carbon atoms, $B^1$ and $B^2$ each independently are as defined above for A in the general formula (I), $Z^2$ is a divalent hydrocarbon group of 1 to 16 carbon atoms, and s and t each independently are an integer of 1 to 28.

3. The photosensitive resin composition of claim 1, wherein the component (A) is a carboxyl group-containing binder polymer which contains styrene or a styrene derivative as a copolymerized constituent and comprises copolymerized constituents consisting of 15 to 35% by weight of methacrylic acid, 10 to 35% by weight of styrene or a styrene derivative and 30 to 75% by weight of a monomer represented by the general formula (III)

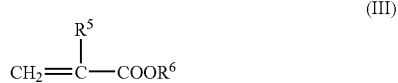

wherein $R^5$ is a hydrogen atom or a methyl group, and $R^6$ is an alkyl group of 1 to 12 carbon atoms.

4. The photosensitive resin composition of claim 1, wherein the component (A) is a carboxyl group-containing binder polymer which contains styrene or a styrene derivative as copolymerized constituent and has a weight average molecular weight of 30,000 to 80,000.

5. The photosensitive resin composition of claim 1, which comprises 40 to 70 parts by weight of the component (A), 0.1 to 10 parts by weight of the component (B) and 30 to 60 parts by weight of the component (C) relative to 100 parts by weight of a sum total of the component (A) and the component (C).

6. A photosensitive resin composition comprising (A) a carboxyl group-containing binder polymer which contains styrene or a styrene derivative as a copolymerized constituent;

(B) a 2,4,5-triarylimidazole dimer as a photo-polymerization initiator, and (C') a photo-polymerizable compound having in its molecule at least one polymerizable ethylenically unsaturated bond which comprises a compound represented by the general formula (V)

wherein $R^1$ is a hydrogen atom or a methyl group, B is an ethylenoxy group, $Z^1$ is a halogen atom, an alkyl group of 1 to 20 carbon atoms, a cycloalkyl group of 3 to 10 carbon atoms, an aryl group of 6 to 14 carbon atoms, an amino group, an alkylamino group of 1 to 10 carbon atoms, a dialkylamino group of 2 to 20 carbon atoms, a nitro group, a cyano group, a mercapto group, an alkylmercapto group of 1 to 10 carbon atoms, an allyl group, a hydroxyalkyl group of 1 to 20 carbon atoms, a carboxyalkyl group wherein the alkyl group has 1 to 10 carbon atoms, an acyl group having an alkyl group of 1 to 10 carbon atoms, an alkoxy group of 1 to 20 carbon atoms or a group containing an heterocyclic group, at least one $Z^1$ is an alkyl group of 1 to 20 carbon atoms, m is an integer of 6 to 18, and n is an integer of 1 to 5.

7. A photosensitive resin composition comprising (A) a carboxyl group-containing binder polymer which contains styrene or a styrene derivative as a copolymerized constituent, (B) a 2,4,5-triarylimidazole dimer as a photo-polymerization initiator, and (C'') a photo-polymerizable compound having in its molecule at least one polymerizable ethylenically unsaturated bond which comprises a compound represented by the general formula (VI)

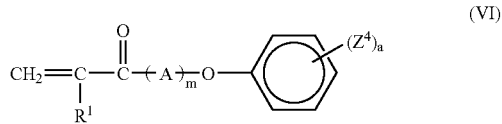

wherein $R^1$ is a hydrogen atom or a methyl group, A is an alkylenoxy group of 2 to 6 carbon atoms, $Z^4$ is an alkyl group of 1 to 20 carbon atoms, m is an integer of 6 to 18, and a is an integer of 1 to 5.

8. A photosensitive element produced by applying the photosensitive resin composition of claim 1, 6 or 7 to a support and then drying the photosensitive resin composition to form a photosensitive resin composition layer.

9. The photosensitive element of claim 8, wherein a protective film is applied to the photosensitive resin composition layer.

10. A process for producing a resist pattern comprising laminating the photosensitive element of claim 8 on a substrate to be processed for forming a circuit with the photosensitive resin composition layer placed in contact with the substrate, exposing the photosensitive resin composition layer by irradiating it with an active ray in a pattern of an image to radiation-cure exposed areas of the photosensitive resin composition layer, and then developing by removing unexposed areas of the photosensitive resin composition layer.

11. The process of claim 10, wherein a protective film is applied to the photosensitive resin composition layer, and wherein the photosensitive element is laminated on the substrate while the protective film is being peeled off from the photosensitive resin composition layer.

12. A process for producing a printed wiring board, comprising etching or plating the substrate bearing the resist pattern produced by the process of claim 10.

13. The photosensitive resin composition of claim 6, wherein the component (C') is a photo-polymerizable compound having in its molecule at least one polymerizable ethylenically unsaturated bond, which comprises a compound represented by the general formula (V) and a compound represented by the general formula (II)

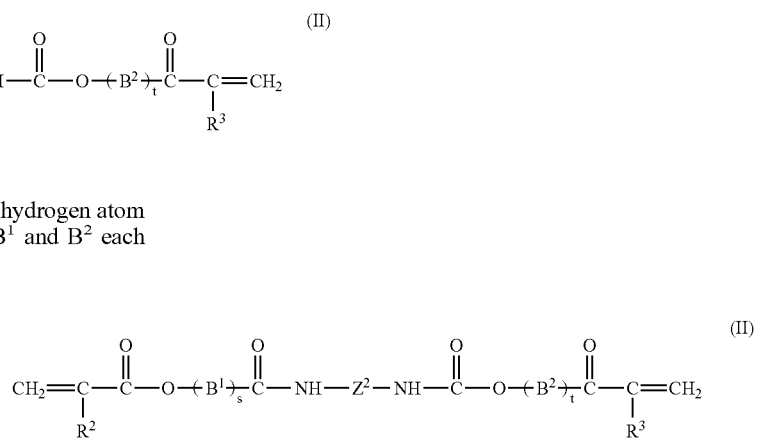

wherein $R^2$ and $R^3$ each independently are a hydrogen atom or an alkyl group of 1 to 6 carbon atoms, $B^1$ and $B^2$ each independently are an alkylenoxy group of 2 to 6 carbon atoms, $Z^2$ is a divalent hydrocarbon group of 1 to 16 carbon atoms, and s and t each independently are an integer of 1 to 28.

14. The photosensitive resin composition of claim 6, wherein the component (A) is a carboxyl group-containing binder polymer which contains a styrene derivative as a copolymerized constituent and comprises copolymerized constituents consisting of 15 to 35% by weight of methacrylic acid, 10 to 35% by weight of styrene or a styrene derivative and 30 to 75% by weight of a monomer represented by the general formula (III)

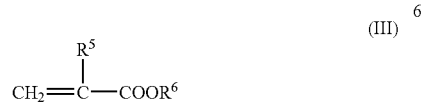

wherein $R^5$ is a hydrogen atom or a methyl group, and $R^6$ is an alkyl group of 1 to 12 carbon atoms.

15. The photosensitive resin composition of claim 6, wherein the component (A) is a carboxyl group-containing binder polymer which contains styrene or a styrene derivative as a copolymerized constituent and has a weight average molecular weight of 30,000 to 80,000.

16. The photosensitive resin composition of claim 6, which comprises 40 to 70 parts by weight of the component (A), 0.1 to 10 parts by weight of the component (B) and 30 to 60 parts by weight of the component (C') relative to 100 parts by weight of a sum total of the component (A') and the component (C').

17. The photosensitive resin composition of claim 7, wherein the component (C") is a photo-polymerizable compound having in its molecule at least one polymerizable ethylenically unsaturated bond, which comprises a compound represented by the general formula (VI) and a compound represented by the general formula (II)

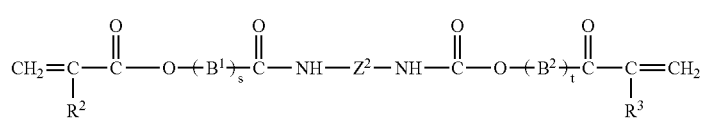

wherein $R^2$ and $R^3$ each independently are a hydrogen atom or an alkyl group of 1 to 6 carbon atoms, $B^1$ and $B^2$ each independently are an alkylenoxy group of 2 to 6 carbon atoms, $Z^2$ is a divalent hydrocarbon group of 1 to 16 carbon atoms, and s and t each independently are an integer of 1 to 28.

18. The photosensitive resin composition of claim 7, wherein the component (A) is a carboxyl group-containing binder polymer which contains a styrene derivative as a copolymerized constituent and comprises copolymerized constituents consisting of 15 to 35% by weight of methacrylic acid, 10 to 35% by weight of styrene or a styrene derivative and 30 to 75% by weight of a monomer represented by the general formula (III)

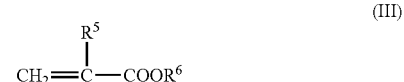

wherein $R^5$ is a hydrogen atom or a methyl group, and $R^6$ is an alkyl group of 1 to 12 carbon atoms.

19. The photosensitive resin composition of claim 7, wherein the component (A) is a carboxyl group-containing binder polymer which contains styrene or a styrene derivative as a copolymerized constituent and has a weight average molecular weight of 30,000 to 80,000.

20. The photosensitive resin composition of claim 7, which comprises 40 to 70 parts by weight of the component (A), 0.1 to 10 parts by weight of the component (B) and 30 to 60 parts by weight of the component (C") relative to 100 parts by weight of a sum total of the component (A') and the component (C").

21. The photosensitive resin composition of claim 1, which further contains 2,2-bis[4-(acryloxypolyethoxy)phenyl]propane or 2,2-bis[4-(methacryloxypolyethoxy)phenyl]propane as a photo-polymerizable compound having in its molecule at least one polymerizable ethylenically unsaturated bond.

22. The photosensitive resin composition of claim 6, which further contains 2,2-bis[4-(acryloxypolyethoxy)phenyl]propane or 2,2-bis[4-(methacryloxypolyethoxy)phenyl]propane as a photo-polymerizable compound having in its molecule at least one polymerizable ethylenically unsaturated bond.

23. The photosensitive resin composition of claim 7, which further contains 2,2-bis[4-(acryloxypolyethoxy)phenyl]propane or 2,2-bis [4-(methacryloxypolyethoxy)phenyl]propane as a photo-polymerizable compound having in its molecule at least one polymerizable ethylenically unsaturated bond.

24. The photosensitive resin composition of claim 1, wherein said (B) a 2, 4, 5-triarylimidazole dimer as a photo-polymerization initiator, is halogenated.

25. The photosensitive resin composition of claim 6, wherein said (B) a 2, 4, 5-triarylimidazole dimer as a photo-polymerization initiator, is halogenated.

26. The photosensitive resin composition of claim 7, wherein said (B) a 2, 4, 5-triarylimidazole dimer as a photo-polymerization initiator, is halogenated.

* * * * *